United States Patent
Fujimoto et al.

(10) Patent No.: US 7,670,879 B2
(45) Date of Patent: Mar. 2, 2010

(54) MANUFACTURING METHOD OF SEMICONDUCTOR MODULE INCLUDING SOLID-LIQUID DIFFUSION JOINING STEPS

(75) Inventors: Kozo Fujimoto, Hyogo (JP); Hirohiko Watanabe, Tokyo (JP); Kazutaka Ikemi, Ibaraki (JP); Keiichi Matsumura, Tokyo (JP); Masayoshi Shimoda, Tokyo (JP); Katsumi Taniguchi, Kanagawa (JP); Tomoaki Goto, Nagano (JP)

(73) Assignee: Fuji Electric Holdings Co., Ltd. (JP)

( * ) Notice: Subject to any disclaimer, the term of this patent is extended or adjusted under 35 U.S.C. 154(b) by 733 days.

(21) Appl. No.: 10/591,723

(22) PCT Filed: Mar. 2, 2004

(86) PCT No.: PCT/JP2004/002538

§ 371 (c)(1),
(2), (4) Date: Jan. 8, 2007

(87) PCT Pub. No.: WO2005/086218

PCT Pub. Date: Sep. 15, 2005

(65) Prior Publication Data

US 2007/0197017 A1   Aug. 23, 2007

(30) Foreign Application Priority Data

Aug. 30, 2002 (JP) ............... 2002-254951
Aug. 22, 2003 (JP) ............... 2003-298057

(51) Int. Cl.
*H01L 21/50* (2006.01)
*H01L 21/44* (2006.01)

(52) U.S. Cl. ............ 438/123; 438/652; 438/653

(58) Field of Classification Search ........ 438/123, 438/652, 653; 257/E21.469
See application file for complete search history.

(56) References Cited

U.S. PATENT DOCUMENTS

| 4,746,055 | A | | 5/1988 | Ingram et al. |
| 5,360,991 | A | * | 11/1994 | Abys et al. .............. 257/666 |
| 5,611,481 | A | | 3/1997 | Akamatsu et al. |
| 2002/0006685 | A1 | | 1/2002 | Petitbon et al. |
| 2002/0149117 | A1 | | 10/2002 | Shibata |
| 2007/0152025 | A1 | | 7/2007 | Fujimoto et al. |

FOREIGN PATENT DOCUMENTS

DE   4303790 A1   8/1994

(Continued)

OTHER PUBLICATIONS

Office Action, dated Aug. 1, 2008, issued in EP application No. 04716328.2-2203 which corresponds to related co-pending U.S. Appl. No. 10/591,724.

(Continued)

*Primary Examiner*—William M. Brewster
(74) *Attorney, Agent, or Firm*—Rossi, Kimms & McDowell, LLP

(57) ABSTRACT

The present invention provides a manufacturing method of a semiconductor module which enables the joining at a low temperature within a short time and can obtain more reliable joining portions by performing the joining without using a solder joining medium. The manufacturing method of a semiconductor module includes a first joining step for joining first circuit electrodes which are formed on a circuit board and back-surface-side die electrodes of a semiconductor die, a second joining step for joining the front-surface-side electrodes of the semiconductor die and one ends of lead frames, and a third joining step for joining another ends of the lead frame and second circuit electrodes which are formed on the circuit board, wherein a low-melting-temperature metal layer is formed on one conductive portion of a pair of conductive portions to be joined and, thereafter, the low-melting-temperature metal layer is heated and pressurized thus diffusing the low-melting-temperature metal layer into the pair of conductive portions by solid-liquid diffusion whereby the conductive portions are joined to each other.

22 Claims, 3 Drawing Sheets

FOREIGN PATENT DOCUMENTS

| | | | |
|---|---|---|---|
| DE | 10003671 | A1 | 8/2000 |
| EP | 0966038 | A2 | 12/1999 |
| JP | 55-095333 | | 7/1980 |
| JP | 59-054250 | | 3/1984 |
| JP | 59-54250 | A | 3/1984 |
| JP | 4-89211 | A | 3/1992 |
| JP | 05-009713 | * | 1/1993 |
| JP | 5-9713 | | 1/1993 |
| JP | 05-074824 | | 3/1993 |
| JP | 5-74824 | A | 3/1993 |
| JP | 08-003732 | | 1/1996 |
| JP | 8-3732 | A | 1/1996 |
| JP | 09-036186 | | 2/1997 |
| JP | 9-36186 | A | 2/1997 |
| JP | 10-256319 | | 9/1998 |
| JP | 10-256319 | A | 9/1998 |
| JP | 2001-274195 | | 10/2001 |
| JP | 2001-274195 | A | 10/2001 |
| JP | 2001-274201 | | 10/2001 |
| JP | 2001-274201 | A | 10/2001 |
| JP | 2002-43348 | A | 2/2002 |
| JP | 2002-110726 | | 4/2002 |
| JP | 2002-110726 | A | 4/2002 |
| JP | 2002-289768 | | 10/2002 |
| JP | 2002-289768 | A | 10/2002 |
| JP | 2003084436 | A | 3/2003 |
| JP | 2003302065 | A | 10/2003 |
| JP | 2004-111935 | A | 4/2004 |
| JP | 2004-111936 | A | 4/2004 |

OTHER PUBLICATIONS

Relevant portion of International Search Report of corresponding PCT Application PCT/JP2004/002538.

Supplementary European search report issued in corresponding EP patent application No. 04716348.0-2203, mailed Jan. 25, 2008.

Notification of Reasons for Refusal issued in corresponding JP patent application No. 2003-298057, mailed Jul. 3, 2007.

"Submission of Publications and the Like", Observation by Third Party, dated Jun. 11, 2007, for JP patent application No. 2003-298056, which corresponds to related co-pending U.S. Appl. No. 10/591,724.

"Metals Databook"; The Japan Institute of Metals, pp. 420 and 460. Cited in "Submission of Publications and the Like" for JP patent application 2003-298056 and the relevancy explained therein.

Notification of Reasons for Refusal issued in JP patent application No. 2003-298056, mailing date Jul. 3, 2007, which corresponds to related co-pending U.S. Appl. No. 10/591,724.

Supplementary European search report issued in EP patent application No. 04716328.2-2203, mailing date Feb. 5, 2008, which corresponds to related co-pending U.S. Appl. No. 10/591,724.

Relevant portion of International Search Report of corresponding PCT Application PCT/JP2004/002534 of co-pending U.S. Appl. No. 10/591,724.

Kozo Fujimoto et al., "Research on Electronic Device Implementation Process Using Low-Melting Metallic Thin Layer and Interface Properties thereof," Annual Report, Nov. 1, 2002, pp. 53-54, Issue No. 7, Cooperative Research Center for Advanced Science and Technology, Osaka University, Japan.

Related co-pending U.S. Appl. No. 10/591,724; Kozo Fujimoto et al.; Electronic Part Mounting Method.

Office Action, dated Aug. 7, 2008, issued in corresponding EP application No. 04716348.0-2203.

Translation of the International Preliminary Report on Patentability, issued for corresponding PCT/JP2004/002538, dated Dec. 7, 2006. (including written opinion).

Machine Translation of JP-2002110726 (see Foreign Patent Cite No. 1).

Notification of Reasons for Refusal, dated Jun. 4, 2009, issued in corresponding JP 2006-510560, pp. 1-5. Partial translation provided, pp. 1-6.

Notification of Reasons for Refusal, dated Jul. 7, 2009, issued in corresponding Japanese Patent Application 2006-510559, pp. 1-5. Partial Translation.

* cited by examiner

US 7,670,879 B2

MANUFACTURING METHOD OF SEMICONDUCTOR MODULE INCLUDING SOLID-LIQUID DIFFUSION JOINING STEPS

TECHNICAL FIELD

The present invention relates to, for example, a manufacturing method of a semiconductor module such as a power semiconductor using a lead frame and aluminum wire bonding.

BACKGROUND ART

A power conductor is a large-capacity semiconductor which exhibits a voltage or a current larger than a voltage or a current used in a semiconductor for a personal computer or the like and has been popularly used in an electric power field, rail roads, automobiles, household electric appliances and the like, Among modules which use such a power semiconductor, in a module-of a power transistor semiconductor of a general-purpose inverter having a capacitance of 0.1 kW to 5.5 kW which is used as a control device for various motors, power transformers or the like, a lead frame made of copper alloy has been conventionally used to decrease an electric resistance value of wiring and, at the same time, to obtain the excellent thermal characteristics.

FIG. 4 shows one example of the conventional structure of the semiconductor module which uses a semiconductor chip which constitutes one of power semiconductors and is referred to as an insulation gate type bipolar transistor (IGBT).

The semiconductor module is mainly constituted of a heat radiation plate 83 which is joined to a substrate 80, a semiconductor chip 90 which is joined to the heat radiation plate 83, and a lead frame 95 which has one end thereof joined to the semiconductor chip 90.

Electrodes are formed on both front and back surfaces of the semiconductor chip 90, wherein the collector electrode 91 is formed on the back surface of the semiconductor chip 90 and an emitter electrode 92 is formed on the front surface of the semiconductor chip 90. Further, the heat radiation plate 83 is joined to the collector electrode 91 on the back surface of the semiconductor chip 90 using a high-temperature solder layer 71. Still further, a lower surface of the heat radiation plate 83 is joined to a collector-side electrode 81 formed on the printed wiring board 80 using a low-temperature solder layer 72.

On the other hand, to an emitter electrode 92 formed on the surface of the semiconductor chip 90, one end of the lead frame 95 is joined using a high-temperature solder layer 73. Further, another end of the lead frame 95 is joined to a lead frame electrode 82 formed on the printed wiring board 80 using a low-temperature solder layer 74.

The manufacturing method of this power semiconductor module is as follows. First of all, in a non-oxidizing atmosphere using a carbon jig, the heat radiation plate 83, the semiconductor chip 90 and one end of the lead frame 95 are integrally formed by a joining step using the high-temperature solder layers 71, 73.

Next, in a reflow step which uses cream solder, the lower surface of the heat radiation plate 83 and another end of the lead frame 95 are respectively joined to the collector-side electrode 81 and the lead frame electrode 82 which are formed on the printed wiring board 80 by the low-temperature solder layers 72, 74 whereby a power semiconductor module having the structure shown in FIG. 4 is manufactured.

Here, as a conventional structural example of the semiconductor module which uses the semiconductor chip of insulation gate type bipolar transistor (IGBT) but differs from the semiconductor module shown in FIG. 4, the constitution shown in FIG. 5 is also known.

The semiconductor module shown in FIG. 5 mainly includes a circuit board 280 which is joined to a heat radiation plate 283 and is formed of a DBC substrate, a semiconductor die 290 which is joined to the circuit board 280 and is formed of a semiconductor chip, and a bonding wire 295 which has one end thereof joined to the semiconductor die 290.

Electrodes are formed on both front and back surfaces of the semiconductor die 290, wherein a back-surface die electrode 291 which constitutes a collector electrode is formed on the back surface of the semiconductor die 290 and a front-surface die electrode 292 which constitutes an emitter electrode is formed on a surface of the semiconductor die 290. Further, the heat radiation plate 283 is made of a metal material such as Cu or the like, while the circuit board 280 which is formed of the DBC substrate is constituted by forming electrodes 280 B, 280 C and 280 D formed of a conductive layer made of Cu or the like on both surfaces of a ceramic substrate 280A.

To the back surface die electrode 291 of the semiconductor die 290, a first circuit electrode 280 B which constitutes a collector conductive layer on an upper surface of the circuit board 280 is joined by means of a joining portion 271, and a third circuit electrode 280 D which constitutes a heat-radiation-plate conductive layer formed on a lower surface of the circuit board 280 is joined to the heat radiation plate 283 by means of a joining portion 272.

On the other hand, a front-surface die electrode 292 of the semiconductor die 290 and a second circuit board 280 C which constitutes a lead-frame conductive layer formed on an upper surface of the circuit board 280 are joined by a bonding wire 295.

Then, the above-mentioned joining portions 271, 272 constitute joining portions formed by solder joining.

Further, with respect to a technique relevant to the formation of the above-mentioned solder layer, a method which forms solder bumps made of alloy by a vapor deposition method has been known. For example, as a method for forming lead-free solder bumps due to the formation of a multi-layered film, JP-A-2002-43348 discloses a technique in which an Sn film and an M film whose film thicknesses are set to obtain the composition of $Sn_{1-x}M_x$ (M: containing at least one of Au, In and x being set to satisfy the relationship of $0<x<0.5$) are alternately vapor-deposited to form a multilayered film and, thereafter, a mask is removed to form a solder bump precursor which is formed of the above-mentioned multilayered film, subsequently, annealing is applied to the solder bump precursor to make the composition of the solder bump precursor uniform and, further, the solder bump precursor is subject to the reflow at an eutectic temperature of the precursor thus forming the solder bumps.

Further, JP-A-5-9713 discloses an alloy vapor deposition method in which base alloy whose composition and quantity are adjusted to obtain an alloy film of desired composition and desired thickness is preliminarily prepared in a crucible for vapor deposition, and the base alloy is completely evaporated to form a targeted alloy film on a substrate and, at the same time, the base alloy composition for vapor-depositing alloy having the targeted composition is preliminarily obtained thus obtaining a vapor deposited film of alloy having the arbitrary composition.

In the above-mentioned manufacturing method of a power semiconductor module using the solder which constitutes the prior art, as explained in conjunction with the example shown in FIG. 4, for example, the manufacturing method includes steps which perform heating twice, that is, the joining step which uses the high-temperature solder and the step which performs solder joining using the cream solder having a melting point lower than a melting poring of the high-temperature solder. Here, particularly in the joining step which uses the high-temperature solder, a high temperature of approximately 300° C. is required and hence, there arises a drawback that the semiconductor die is liable to be easily damaged by heat generated at the time of joining. Further, there also exists a drawback that the steps become complicated since two kinds of solders, that is, the high-temperature solder and the low-temperature solder are used.

Further, the power semiconductor module allows a large current to pass therethrough and hence, the power semiconductor module generates heat remarkably whereby a thermal stress arises due to the difference in thermal expansion rate among respective constitutional materials. For example, in the conventional solder joining used in the examples shown in FIG. 4 and FIG. 5, there has been a drawback that a joining interface is broken by this thermal stress.

Still further, the reliability of the joining portion such as the strength, fatigue lifetime depends on the property of a material which is interposed between parts to be joined and a solder material has a drawback with respect to the high-temperature property and the thermal fatigue lifetime. Particularly, with respect to a die such as the power semiconductor module to which a large current is applied, there exists a possibility of the lowering of the insulating property of the power semiconductor module attributed to an organic material and hence, it is impossible to use a flux which serves to remove surface oxide of a joining material thus joining the parts. Accordingly, in the conventional solder joining, there has been a drawback that a defect of several 100 μm level may occur in the joining portion attributed to contamination or oxide during a joining step.

Further, in the method for forming the lead-free solder bumps disclosed in JP-A-2002-43348, the joining at a low temperature for a short time is insufficient. For example, the joining at a low temperature of 200° C. or less and for a short time is difficult.

Further, in the alloy vapor deposition method of the JP-A-5-9713, it is necessary to obtain the relationship between the composition of the base alloy in the crucible and the alloy composition in the vapor-deposited film and, it is necessary to determine the composition of the base alloy based on a correction curve thus giving rise to a drawback that the preparation steps up to the vapor deposition becomes cumbersome.

The present invention has been made in view of these drawbacks and it is an object of the present invention to provide a manufacturing method of a semiconductor module which enables the joining of an electrode of a semiconductor die, an electrode on a circuit board, a connecting member such as a lead frame and, further, a heat radiating member at a low temperature within a short time, and can obtain a highly reliable joining portion by performing the joining without using a solder joining medium.

DISCLOSURE OF THE INVENTION

To achieve the above-mentioned object, a first aspect of the present invention is directed to a manufacturing method of a semiconductor module which includes: a first joining step for joining first circuit electrodes which are formed on a circuit board and back-surface-side die electrodes of a semiconductor die which forms die electrodes on both front and back surfaces; a second joining step for joining the front-surface-side die electrodes of the semiconductor die and one ends of linear or plate-like connecting members; and a third joining step for joining another ends of the connecting members and second circuit electrodes which are formed on the circuit board, wherein in at least one of the first joining step, the second joining step and the third joining step, a low-melting-point metal layer is preliminarily formed on at least one of a pair of conductive portions to be connected with each other and, thereafter, the pair of conductive portions are arranged to face each other and are heated and pressurized at a temperature which melts at least the low-melting-point metal thus diffusing the low-melting-point metal layer into the pair of conductive portions by solid-liquid diffusion.

According to the present invention, since the low-melting-point metal layer is formed on a pair of conductive portions to be connected with each other, although it may depend on a material of the low-melting-point metal layer, it is possible to realize the joining at a temperature of 200° C. or below, for example, and within a short time and hence, it is possible to prevent thermal damages from being applied to the semiconductor die. Further, it is enough to supply an amount of low-melting-point metal layer which is sufficient for diffusion and hence, it is possible to form a film having a total thickness of 10 μm or less, for example. That is, it is possible to make a joining film thickness extremely small and hence, it is possible to decrease an electric resistance and a thermal resistance of the joining portion to extremely small values. Accordingly, the generation of Joule heat at the joining portion can be reduced and a heat radiation effect can be expected and hence, the method is particularly effective as a joining method of the power conductor which is required to suppress the generation of heat thereof. The low-melting-point metal layer can be easily diffused into the conductive portions compared with Sn/Pb-based solder or Sn/Ag-based solder and hence, it is possible to reduce a thickness of a reaction layer at a joining interface compared to solder whereby the reliability of the joining portion is enhanced.

The second aspect of the semiconductor module according to the present invention is basically directed to a manufacturing method of a semiconductor module which is characterized by applying the first aspect of the above-mentioned manufacturing method to a manufacturing method of a semiconductor module which further includes a fourth joining step which joins a circuit board and a heat radiating member. That is, a in a manufacturing method of a semiconductor module which includes: a first joining step for joining first circuit electrodes which are formed on a circuit board and back-surface-side die electrodes of a semiconductor die which forms die electrodes on both front and back surfaces; a second joining step for joining the front-surface-side die electrodes of the semiconductor die and one ends of linear or plate-like connecting members; a third joining step for joining another ends of the connecting members and second circuit electrodes which are formed on the circuit board; and a fourth joining step for joining a third circuit electrode formed on the circuit board and a heat radiating member made of metal wherein in at least one of the first joining step, the second joining step and the third joining step and the fourth joining step, a low-melting-point metal layer is preliminarily formed on at least one of a pair of conductive portions to be connected with each other and, thereafter, the pair of conductive portions are arranged to face each other and are heated and pressurized at a temperature which melts at least the low-melting-point metal thus diffusing the low-melting point metal layer into the pair of conductive portions by solid-liquid diffusion whereby the pair of conductive portions are joined to each other.

Due to such a constitution, it is also possible to obtain the manner of operation and advantageous effects substantially equal to the manner of operation and advantageous effects of the first aspect of the present invention. Particularly, since the joining of the third circuit electrode on the circuit board and the heat radiating member is performed by solid-liquid diffusion and hence, the second aspect of the present invention further obtains the following manner of operation and advantageous effects.

That is, the reduction of the heat resistance of the joining portion between the third circuit electrode on the circuit board and the heat radiating member is particularly important with respect to the heat radiation property of the semiconductor module. In the above-mentioned invention which applies the solid-liquid diffusion joining to the joining portion, compared to the conventional constitution shown in FIG. 5 which performs the joining by solder joining, it is possible to make the joining thickness to the extremely small value thus reducing the heat resistance to an extremely small value as described above and hence, the heat radiation effect can be further enhanced.

Further, as a joining method which can reduce the heat resistance of the joining portion of Cu materials such as the joining portion of the third circuit electrode on the circuit board and the heat radiating member, it may be possible to apply a method which directly joins the Cu materials tighter by thermo-compression bonding or the like. However, such a direct joining method is performed at an extremely high temperature of approximately 800° C. Accordingly, when this joining method is applied to the joining portion of the third circuit electrode on the circuit board and the heat radiating member in the semiconductor module, particularly in case of the joining with a large area in which the third circuit electrode is formed on the substantially whole surface of one surface of the circuit board and the circuit board is joined with the heat radiation member with such a whole surface, there arises a drawback that a thermal stress is increased. To the contrary, according to the present invention which applies the solid-liquid diffusion joining to the joining portion, as described above, it is possible to perform the joining at the low temperature of 200° C. or less, for example, and hence, it is possible to reduce the thermal stress in the joining with the large joining area.

According to the present invention, it is also preferable that the low-melting-point metal layer is formed on at least one of the pair of conductive portions, a metal foil is interposed between the pair of conductive portions, and the pair of conductive portions are heated and pressurized.

Due to such a constitution, with the use of the metal foil having a thickness of 1 to 500 μm, for example, as an intermediate joining material, the low-melting-point metal not only diffuses into the conductive portion side but also diffuses into the intermediate joining material, and in the regions where the low-melting-point metal layer is supplied, a layer in which the intermediate joining material is diffused is expanded and hence, even when a joining time is limited, it is possible to prevent a state that a non-reacted portion where the low-melting-point metal is held from remaining as it is and hence, the generation of a defect in a joining surface can be prevented thus ensuring the stable joining.

Further, when the materials of the pair of conductive portions are made different from each other and the diffusion speeds of the low-melting-point metal at which the low-melting-point metal layer diffuses into the conductive portion differ between the respective conductive portions, the diffusion of the conductive portion becomes non-uniform between both conductive portions. Accordingly, within the limited joining time, in the region of the conductive side which exhibits the delayed diffusion speed, a non-reacted portion which is held in a state of low-melting-point metal particularly is liable to remain as it is. However, with the use of the metal foil as the intermediate joining material, even in the non-reacted portion of the low-melting-point metal layer on the conductive portion side which exhibits the delayed diffusion speed, the layer in which the intermediate joining material is diffused expands whereby it is possible to prevent the non-reacted portion which is held in a state of low-melting-point metal from remaining as it is. Accordingly, the occurrence of a defect on a joining surface is prevented thus realizing the stable joining of the different kind of materials.

A third aspect of the present invention is directed to a manufacturing method of a semiconductor module which includes: a first joining step for joining first circuit electrodes which are formed on a circuit board and back-surface-side die electrodes of a semiconductor die which forms die electrodes on both front and back surfaces; a second joining step for joining the front-surface-side die electrodes of the semiconductor die and one ends of linear or plate-like connecting members; and a third joining step for joining another ends of the connecting members and second circuit electrodes which are formed on the circuit board, wherein in at least one of the first joining step, the second joining step and the third joining step, a low-melting-point metal layer is preliminarily formed on at least one surface or both surfaces of a metal foil, and, thereafter, the pair of conductive portions to be connected are arranged to face each other, the metal foil is interposed between the pair of conductive portions, the pair of conductive portions are heated and pressurized at a temperature which melts at least the low-melting-point metal thus diffusing the low-melting-point metal layer into the pair of conductive portions by solid-liquid diffusion whereby the pair of conductive portions are joined to each other.

Also in this aspect of the present invention, in the same manner as the above-mentioned aspect of the present invention, the layer in which the intermediate joining material is diffused is expanded in the region into which the low-melting-point metal is supplied and hence, it is possible to prevent the non-reacted portion which is held in a state of low-melting-point metal from remaining as it is even when the joining time is limited. Further, even when the materials of the pair of conductive portions are made different from each other and the diffusion speed of the low-melting-point metal at which the low-melting-point metal layer diffuses into the conductive portion differs between the respective conductive portions, a layer in which the intermediate joining material is diffused is also expanded to a non-reacted portion of a low-melting-point metal on a conductive portion side with delayed diffusion speed and hence, it is possible to prevent a state that a non-reacted portion where the low-melting-point metal is held from remaining as it is whereby it is possible to prevent the generation of a defect on a joining surface thus realizing the stable joining of the different kinds of materials.

In the present invention, it is preferable that the above-mentioned low-melting-point metal layer contains at least one selected from a group consisting of SnIn, In, Bi, SnBi. Here, any one of the above-mentioned metals has a low melting point of 180° C. or less and can be easily diffused in the conductive portion by solid-liquid diffusion and hence, these metals can be particularly preferably used in the present invention.

The fourth aspect of the manufacturing method of the semiconductor module according to the present invention is basically directed to a manufacturing method of a semiconductor module which is characterized by applying the third aspect of the above-mentioned manufacturing method to a manufacturing method of a semiconductor module which further includes a fourth joining step which joins a circuit board and a heat radiating member. That is, in a manufacturing method of a semiconductor module which includes: a first joining step for joining first circuit electrodes which are formed on a circuit board and back-surface-side die electrodes of a semiconductor die which forms die electrodes on both front and back surfaces; a second joining step for joining the front-surface-side die electrodes of the semiconductor die and one ends of linear or plate-like connecting members; a third joining step for joining another ends of the connecting members and second circuit electrodes which are formed on the circuit board; and a fourth joining step for joining a third circuit electrode formed on the circuit board and a heat radiating member made of metal wherein in at least one of the first joining step and the fourth joining step, the second joining step and the third joining step, a low-melting-point metal layer is preliminarily formed on at least one surface or both surfaces of a metal foil, and, thereafter, the pair of conductive portions to be connected are arranged to face each other, the metal foil is interposed between the pair of conductive portions, the pair of conductive portions are heated and pressurized at a temperature which melts at least the low-melting-point metal thus diffusing the low-melting point metal layer into the pair of conductive portions by solid-liquid diffusion whereby the pair of conductive portions are joined to each other.

Due to such a constitution, it is also possible to obtain the manner of operation and advantageous effects substantially equal to the manner of operation and advantageous effects of the third aspect of the above-mentioned manufacturing method. Particularly, since the joining of the third circuit electrode on the printed circuit board and the heat radiating member is performed by solid-liquid diffusion, it is possible to obtain the above-mentioned excellent manner of operation and advantageous effects in the heat radiation and the reduction of the thermal stress.

Further, in the present invention, it is preferable that a heating temperature at the time of the above-mentioned joining is a temperature which is 0 to 100° C. higher than the melting point of the above-mentioned low-melting-point metal. Any one of the above-mentioned low-melting-point metals is a material having the melting point of 180° C. or less and hence, the heating temperature can be also set to a low temperature whereby it is possible to prevent damages attributed to heat applied to the semiconductor die.

Further, in the present invention, it is also preferable that a total thickness of the low-melting-point metal layer which is formed preliminarily between the above-mentioned pair of electrodes assumes a value which falls within a range from 0.1 to 1 μm. Here, by forming the low-melting-point metal layer into a thin film having the total thickness of 0.1 to 1 μm such that a supply quantity of the low-melting-point metal becomes a quantity necessary for a diffusion reaction at the time of joining and hence, it is possible to reduce a thickness of a reaction layer to an extremely small value. Accordingly, different from the joining material using solder, the reaction layer can obtain physical properties which approximate the physical properties of the base metal material which forms the conductive portions which become objects to be joined such as electrodes, connection members or heat radiation members.

Further, by setting the total thickness of the low-melting-point metal layer to the value which falls within a range from 0.1 to 1 μm, the low-melting-point metal is completely diffused in a base metal which constitutes the electrode and hence, the low-melting-point metal single layer disappears whereby there is no possibility that the low-melting-point-metal in a single body state which does not contribute to the-joining is discharged from an end of the joining portion. Accordingly, the application of pressure necessary for discharging the non-reacted low-melting-point metal is no more necessary and hence, a pressure level at the time of pressurizing can be reduced thus lowering damages on the semiconductor die.

Further, in the present invention, it is preferable that material of the above-mentioned pair of conductive portions is one selected from a group consisting of Cu, Ni, Au, Al or alloy thereof. Here, with respect to one selected from the group consisting of Cu, Ni, Au, Al or alloy thereof, a low-melting-point metal can easily generate the solid-liquid diffusion and hence, these materials are particularly preferably used in the present invention.

Further, in the present invention, it is preferable that the above-mentioned heating-and-pressurizing is performed until the above-mentioned low-melting-point metal layer is completely diffused in the above-mentioned pair of conductive portions by solid-liquid diffusion. Due to such a constitution, the low-melting-point metal layer is completely diffused by solid-liquid diffusion thus forming one alloy layer as a whole. That is, different from soldering, the alloy layer includes no intermediate layer at the joining portion. Accordingly, the reliability of the joining portion does not depend on the characteristic of the interposed joining material but mainly depends on a material of the base metal which forms the conductive portions which constitute objects to be joined such as the electrode, the joining member and the heat radiating member and hence, the reliability of the joining portion is further enhanced.

Further, in the present invention, it is preferable that the above-mentioned heating-and-pressurizing is performed until the above-mentioned low-melting-point metal layer forms an intermediate alloy layer between the above-mentioned pair of conductive portions. Due to such a constitution, the low-melting-point metal layer is not completely diffused and it is sufficient to perform heating until the intermediate alloy layer is formed whereby it is possible to largely shorten time necessary for joining.

Further, in the present invention, it is preferable that the connection member is a lead frame. Due to such a constitution, the lead frame can, in addition to a function of suppressing an electric resistance value of wiring to a small value, perform a function of assisting the heat radiating plate and hence, the lead frame is particularly preferably used as a connecting member of a power semiconductor module with a large heat generation quantity.

Further, in the present invention, the surfaces of the above-mentioned pair of conductive portions may be formed of coarse surfaces having the surface roughness Ra of 0.4 to 10 μm. That is, for example, even when the conductive portion have irregularities on surfaces thereof as in the case of a conductive portion which is formed by electrolytic plating or the like, the low-melting-point metal melts and is filled in the irregularities and hence, it is possible to obtain a favorable joining state even with the small pressurizing.

Further, in the present invention, it is preferable that the above-mentioned low-melting-point metal layer is formed such that at least two kinds of metals which can form alloy are stacked in two layers or more, and the stacked metal layers are preheated to make the metal layers react with each other to form an alloy layer. Due to such a constitution, irregularities of the alloy composition or the supply quantity in the alloy layer can be eliminated and hence, it is possible to realize the stable diffusion joining at the low temperature thus acquiring the high reliable joining portion.

Further, in the present invention, it is preferable that the above-mentioned low-melting-point metal layer is formed by vapor-depositing alloy which constitutes an evaporation source and, at the time of performing the above-mentioned vapor deposition, an evaporation pressure ratio in reaction steps of respective metal components of the above-mentioned alloy is controlled thus forming a film having the target alloy composition. Due to such a constitution, it is possible to perform the control of the composition of the alloy at the time of vapor deposition and hence, it is possible to turn the alloy composition of the low-melting-point metal layer into the eutectic composition which enables the joining at a lowermost temperature thus ensuring the stable diffusion joining at the low temperature. Further, with the use of the vapor deposition method, it is possible to easily form the film having the thickness which allows the easy diffusion of the low-melting-point metal layer by the vapor deposition method.

Further, in the present invention, it is preferable that the above-mentioned low-melting-point metal layer is formed by vapor-depositing alloy which constitutes an evaporation source and, at the time of performing the above-mentioned vapor deposition, a product of an evaporation pressure ratio and an active coefficient ratio in reaction steps of respective metal components of the above-mentioned alloy is controlled thus forming a film having the target alloy composition. Due to such a constitution, it is possible to perform the control of the composition of the alloy at the time of vapor deposition and hence, it is possible to turn the alloy composition of the low-melting-point metal layer into the eutectic composition which enables the joining at a lowermost temperature thus ensuring the stable diffusion joining at the low temperature. Further, with the use of the vapor deposition method, it is possible to easily form the film having the thickness which allows the easy diffusion of the low-melting-point metal layer by the vapor deposition method.

BEST MODE FOR CARRYING OUT THE INVENTION

One embodiment of a manufacturing method of a semiconductor module of the present invention is explained in conjunction with drawings. FIG. 1 is a schematic step view showing the manufacturing method of the present invention.

Figure 1A:
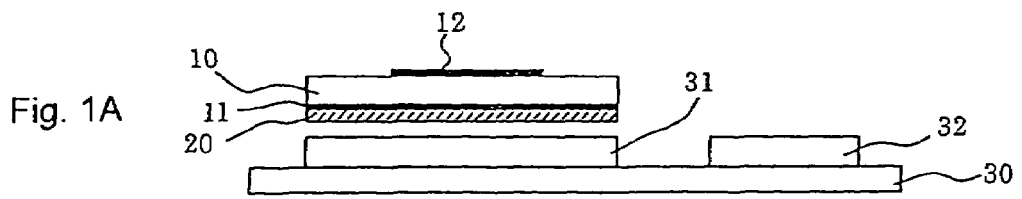
FIG. 1 is a step view showing one embodiment of a manufacturing method of the present invention, wherein (a) shows a state in which electrodes are arranged to face each other, (b) shows a state in which a first joining step is performed, (c) shows a state in which a lead frame is arranged, (d) shows a state in which a second joining step is performed, (e) shows a state in which another end of a lead frame is inclined, and (f) shows a state in which a third joining step is performed.

Hereinafter, the manufacturing method of the present invention is explained in conjunction with FIG. 1. First of all, on a back-surface die electrode 11 of a semiconductor die 10 on which the back-surface die electrode 11 and a surface die electrode 12 are respectively formed, a low-melting-point metal layer 20 having a thickness of equal to or less than 10 μm is formed. As shown in FIG. 1(a), the low-melting-point metal layer 20 is arranged to face a first circuit electrode 31. Here, the first circuit electrode 31 and a second circuit electrode 32 are formed on the same circuit board 30.

As a semiconductor die 10, the above-mentioned power semiconductor such as IGBT is preferably used, for example. However, the semiconductor die 10 is not limited to such power semiconductors.

Although the back-surface die electrode 11 and the front-surface die electrode 12 are not particularly limited, the back-surface die electrode 11 and the front-surface die electrode 12 are preferably made of one selected from a group consisting of Cu, Ni, Au and Al or an alloy of Cu, Ni, Au and Al.

Further, the back-surface die electrode 11 and the front-surface die electrode 12 may be formed of the-stacked structure of Al/Ni/Au, Al/Ti/Ni/Au, Ti/Ni/Au or the like on the semiconductor die 10, for example. In this case, it is preferable that a metal material of an uppermost-surface-layer is one selected from a group consisting of Cu, Ni and Au or an alloy of these metals.

As a method for forming the above-mentioned die electrode, the die electrode may be formed by a conventionally known vapor deposition method, or by patterning using etching or the like.

As a material of a first circuit electrode 31 formed on the substrate, conventionally known electrode materials such as Cu, Ni and the like can be used. Among these materials, it is preferable to use one selected from a group consisting of Cu, Ni, Au and Al or alloy thereof. Further, the first circuit electrode 31 may be formed by conventionally known plating, vapor deposition method or the like. The first circuit electrode 31 may be also formed by patterning using etching or the like.

Here, the circuit electrode in the present invention implies a circuit-board-side electrode which is joined to a back-surface-die electrode of the semiconductor die, wherein when the semiconductor die is directly jointed to the electrode on the circuit board, the electrode becomes the circuit electrode, while when the semiconductor die is joined to the electrode on the circuit board via a heat radiation plate or the like, for example, a surface layer of the heat radiation plate constitutes the circuit electrode of the present invention. As the surface layer, for example, a Ni plating layer or a Ni plating layer/Au plating layer is named, for example.

Here, in view of the acquisition of a favorable contact state, it is preferable that the surface roughness of the back-surface die electrode 11, the front-surface die electrode 12 and the first circuit electrode 31 is smooth. However, in the present invention, the surfaces of the back-surface die electrode 11, the front-surface die electrode 12 and the first circuit electrode 31 may exhibit rough surfaces having the surface roughness Ra of 0.4 to 10 μm.

Next, the low-melting-point metal layer 20 is explained. It is sufficient that metal which is used as a material of the low-melting-point metal layer 20 may one which can form alloy with the back-surface die electrode 11 and the first circuit electrode 31 by solid-liquid dispersion. Further, metal may preferably has a melting point of equal to 220° C. or less, and more preferably has a melting point of equal to 180° C. or less. By using such metal, it is possible to perform the joining at a low temperature compared with a conventionally-used tin-lead eutectic solder (whose melting point is at 183° C.) or an SnAg type which is a representative lead-free solder (whose melting point is between 210° C. to 223° C.) and hence, a thermal damage to the semiconductor die can be suppressed.

As such a low-melting-point metal, for example, a metal including at least a kind which is selected from SnIn, In, Bi, and SnBi is named. These metal materials can be used singularly or in combination and a composition ratio of the metal materials in case of an alloy can be set properly.

Further, on the basis of the above-mentioned metal materials, a small amount of elements to be added may be included in the alloy. As such elements to be added, for example, Cu, Ni, Ge, Sb, Ag and P or the like may be named.

Further, the total thickness of the low-melting-point metal layer 20 is equal to or less than 10 μm, and it is preferable to set the total thickness to a value which falls within a range from 0.1 to 10 μm, and it is more preferable to set the total thickness to a value which falls within a range from 0.1 to 1 μm.

This is because that when the total thickness of the low-melting-point metal layer exceeds 1 μm, the diffusion of the low-melting-point metal is not completed within the joining time of several minutes and hence, the low-melting-point metal is liable to easily remain between the conductive portion such as electrodes in a state that the low-melting-point metal exists as a single body and hence, the reliability of the joining portion is lowered whereby the use of the low-melting-point metal layer with the thickness of more than 1 μm is not desirable.

Further, assuming the total thickness of the low-melting-point metal layer is equal to 0.1 μm or less, it is not preferable because the joint is not performed sufficiently due to the influence of the surface roughness of the conductive portion such as the electrode which is the base metal. That is, a lower limit of film thickness of the low-melting-point metal layer is dependent on the surface roughness of the conductive portion such as the electrode, wherein assuming the low-melting-point metal layer is sufficiently thick with respect to the surface roughness of the conductive portion such as the electrode, film surfaces of the soft low-melting-point metal layers adhere to each other without a gap by pressurization and hence, it is possible to form a dispersion film without a void. However, it is considered that the surface roughness of the conductive portion such as the electrode is generally equal to or less than 0.1 μm and hence, the lower limit value of the total thickness of the low-melting-point metal layers exhibits 0.1 μm.

In this manner, according to the present invention, it is sufficient to supply a small quantity of the low-melting-point metal which constitutes the joining material and hence, it is possible to set the thickness of the low-melting-point metal layer 20 to, for example, 1 μm whereby a thickness of the joining portion can be made extremely small thus reducing the connection resistance at the time of joining to an extremely small value. Accordingly, the present invention is particularly effective as a joining method in the power semiconductor which is required to suppress the generation of heat thereof.

As a method of forming the low-melting-point metal layer 20, the conventionally-known thin film forming method is available, while the thin film forming method is not particularly limited to the method and a vapor-deposition, a sputtering, a plating, an etching or the like can be used properly. Further, by the vapor-deposition using a metal mask, the etching using a photo resist and the like, the low-melting-point metal layers are formed by a pattern-forming when necessary.

Here, in this embodiment, although the low-melting-point metal layer 20 is formed only on the back-surface die electrode 11, the low-melting-point metal layer 20 may be formed only on the first circuit electrode 31. Further, the low-melting-point metal layer 20 may be formed on both of the back-surface die electrode 11 and the first circuit electrode 31. In this case, provided that the total thickness of the low-melting-point metal layer 20 is 10 μm or less, the respective thicknesses of the low-melting-point metal layers 20 may be made different from each other.

With respect to the above-mentioned method for forming the low-melting-point metal layer, it is preferable to use a method in which at least two kinds of metals which can form a two-or-more-element alloy such as the above-mentioned SnIn or SnBi are stacked in two or more layers and these stacked metal layers are preheated to make the metal layers react with each other thus forming the alloy layer.

For example, in case of SnIn, it is known that although a melting point of Sn is 230° C. and a melting point of In is 157° C., 26.4% of Sn is melted in In by solid solution at a temperature of 121° C. which is lower than 157° C. Accordingly, the Sn layer and the In layer are stacked preliminarily and the stacked layers are made to react with each other by preheating thus forming the SnIn alloy layer having the low-melting-point metal layer and, thereafter, the alloy layer is diffused into the circuit electrode and the die electrode by solid-liquid diffusion thus joining the circuit electrode and the die electrode.

Due to such a method, there are no irregularities with respect to the alloy composition and alloy supply quantity in the alloy layer and hence, it is possible to surely perform the joining at a low temperature thus acquiring the highly reliable joining portion. Here, in case of the above-mentioned SnIn alloy, it is preferable to stack the layers such that the In layer forms an uppermost surface. Due to such a constitution, it is possible to prevent the Sn layer from being oxidized.

Although the film thicknesses of the respective single metal layers are suitably selected in conformity with the target alloy composition, it is preferable that the respective single metal layers have small thicknesses from a viewpoint of the formation of an alloy layer by preheating which spends a short time. To be more specific, it is preferable that the film thicknesses of the single metal layers are set to values which fall within a range from 0.1 to 1 μm. Further, the respective single metal layers may be formed such that each single metal layer is formed of one layer or may be formed of a plurality of layers which are stacked alternately.

As other method for forming the low-melting-point metal layer, when the low-melting-point metal is a two-or-more-element alloy such as SnIn or SnBi, it is preferable to use a method in which the low-melting-point metal layer is formed by vapor deposition using the alloy as an evaporation source, and a film having the target alloy composition is formed by controlling a vapor pressure ratio of the respective metal components of the alloy at the time of performing the vapor deposition.

As described above, the temperature at the time of joining depends on the melting points of the low-melting-point metal layer. For example, with respect to the SnIn alloy, for example, the eutectic temperature is 117° C. and the eutectic composition at such a temperature is In:Sn=52:48. Accordingly, outside this eutectic composition, the melting points of the low-melting-point metal layer is elevated and hence, to ensure the stable low-temperature joining, it is necessary to maintain the alloy composition of the low-melting-point metal layer at In:Sn=52:48.

However, usually, when the alloy thin film layer is formed by the vapor deposition method which uses the base alloy as the single evaporation source, the vapor pressures differ from each other depending on the respective metal components and hence, even when the base alloy whose composition is preliminarily set to In:Sn=52:48 is used as the evaporation source, since the vapor pressures of In and Sn are not equal, the composition of the formed vapor deposition film is displaced from the target composition. Accordingly, by controlling the vapor pressure ratio of respective metal components of the alloy, it is possible to form the film while maintaining the target alloy composition.

Particularly, by preliminarily obtaining the vapor pressure ratio of the respective metal components which makes the alloy composition of the evaporation source and the alloy composition of the alloy layer after vapor deposition equal to each other and by controlling the vapor pressure ratio during the vapor deposition, it is possible to obtain the vapor deposition film having the same composition as the base alloy of the evaporation source as the low-melting-point metal layers and hence, it is possible to eliminate the displacement of the composition of the-formed vapor deposition film from the target composition. The vapor pressure ratio of the respective metal components which constitutes the control condition can be obtained by the following calculation, for example.

First of all, a main component of an alloy steam is an atom of metal which is contained in an alloy and hence, partial pressure of respective components can be estimated by expansively applying the law of Raoult with respect to steam pressure of a solvent of a diluted solution as a formula (1) shown below.

$$a_i = \chi_i \tag{1}$$

Here, $a_i$ and $\chi_i$ indicate an activity and a mol fraction of an i component, respectively. Assuming that a steam pressure in a state of alloy of the i component as $p_i$ and a steam pressure in a pure state of the i component as $p_{i(0)}$, a formula $a_i = p_i/p_{i(0)}$ is established by means of the definition.

Since it is a rare case that the formula (1) is established as it is, for indicating a degree of shifting of a measured value of $a_i$ from the law of Raoult, an activity coefficient $\gamma_I$ which is defined by a formula (2) shown below is used.

$$a_i = \gamma_i \chi_i \tag{2}$$

Since a partial molal free energy change $\Delta G_i$ with respect to an i component of the alloy is given by a formula (3) shown below, the formula can be modified as a formula (4) by using a formula (2).

$$\Delta G_i = RT \ln a_i \tag{3}$$

$$\Delta G_i = RT \ln \gamma_i + RT \ln \chi_i \tag{4}$$

Here, R and T are assumed as gas constant and absolute temperature, respectively. Further, a free energy $\Delta G_i$ in a composition X is indicated by a formula (5) shown below.

$$\Delta G_i = X(1-X)(A_{ij} + (1-2X)B_{ij} + C_{ij}X(1-X)) \tag{5}$$

Here, for example, in the case of the eutectic alloy of SnIn, as shown above, a composition X=52 of In, and a composition X=48 of Sn.

Here, in consideration of a reactivity of In and Cu, by substituting $A_{ij}=-12990$, $B_{ij}=-14383$, $C_{ij}=23982$ and X=0.52 for the respective coefficient of the formula (5), a formula shown below is obtained.

$$\Delta G_i = -1604.62 \, J/mol \tag{6}$$

In a same manner, in consideration of a reactivity of Sn and Cu, by substituting $A_{ij}=-35479$, $B_{ij}=-19182$, $C_{ij}=59493$ and X=0.48 for the respective coefficient of the formula (5), a formula shown below is obtained.

$$\Delta G_i = -5340.65 \, J/mol \tag{7}$$

By using the formulae (3) and (6), an activity $a_A$ in the In-Cu reaction is obtained, and by using the formulae (3) and (7), an activity $a_B$ in the Sn-Cu reaction is obtained. Hereby, formulae (8) and (9) shown below are established. Here, R=8.314 [J·mol$^{-1}$·K$^{-1}$], T=700 K(427° C.)

$$a_A = \exp(\Delta G_i/RT) = 0.835 \tag{8}$$

$$a_B = \exp(\Delta G_i/RT) = 0.632 \tag{9}$$

Then, in consideration of a flux of respective components in vacuum vapor deposition, assuming a surface composition $\chi_A$, $\chi_B$ at a certain instant when a binary alloy is evaporating, a vapor flux ratio $J_A/J_B$ is indicated by formulae (10), (11) shown below.

$$J_A/J_B = (a_A p_A / a_B p_B)(M_B/M_A)^{1/2} \tag{10}$$
$$= (\gamma_A \chi_A p_A / \gamma_B \chi_B p_B)(M_B/M_A)^{1/2}$$
$$= Z(\chi_A/\chi_B)$$

$$Z = (\gamma_A p_A / \gamma_B p_B)(M_B/M_A)^{1/2} \tag{11}$$

When a value Z of the formulae (10), (11) becomes 1, the condition that evaporating component ratio equals to a composition of the original alloy (composition $\chi_A$=52 of In, composition $\chi_B$=48 of Sn) is established. Here, therefore, by substituting molecular mass $M_A$=114 818 of In, molecular mass $M_B$=118.710 of Sn, $a_A$=0.835, $a_B$=0.632 and Z=1 for the formula (10), the following value is obtained.

$$(p_A/p_B) = Z(\chi_A/\chi_B)(a_B/a_A)(M_A/M_B)^{1/2} = 0.81 \tag{12}$$

Accordingly, by performing the vapor deposition under conditions in which the vapor pressure satisfies the formula (12), it is possible to form a SnIn eutectic alloy film on the Cu film such that the ratio between In and Sn becomes In:Sn=52:48.

Here, the above-mentioned vapor pressure ratio ($P_A/P_B$) can be controlled by controlling a temperature of an evaporation source or a degree of vacuum during vapor deposition at the time of actuary performing the vapor deposition. Among these factors, a temperature of the base alloy which constitutes the evaporation source can be controlled by adjusting energy of electron beams for heating when an electron beam vapor deposition apparatus is used. When the temperature of the base alloy in a molten state is changed due to the adjustment of the electron beam energy, evaporation speeds and activities from the evaporation sources of respective metal components are respectively changed, wherein relative change rates of the evaporation speeds and the activities corresponding to the temperature change differ from each other for respective metal components and hence, the vapor pressure ratio is changed.

Next, the degree of vacuum during the vapor deposition is adjusted by evacuating the inside of a vapor deposition vessel using a vacuum pump. When a sum of vapor pressures of the respective metal components is changed due to the adjustment of the degree of vacuum, molar fractions of respective metal components are changed, and the activities of the respective metal components are changed. However, by making the relative change rates of the activities with respect to the change of degree of vacuum different from each other for respective metal components, the vapor pressure ratio is changed.

Either one of the temperature of the evaporation source and the degree of vacuum during vapor deposition may be controlled or the control of the temperature of the evaporation source and the control of the degree of vacuum during vapor deposition may be combined together.

Further, the values of the coefficients $A_{ij}$, $B_{ij}$, $C_{ij}$ which are substituted for the formula (5) in obtaining the activities $a_A$, $a_B$ in the In-Cu reaction and Sn-Cu reaction are physical values which are obtained based on predetermined reference temperature conditions and hence, the heater heating temperature with respect to the vapor-deposition object is adjusted such that the temperature of the Cu electrode which constitutes the vapor-deposition object becomes the above-mentioned reference temperature.

Here, in the present invention, in place of the vapor pressure ratio in the reaction steps of the respective metal components during the above-mentioned vapor deposition, a product of the vapor deposition ratio and the activity coefficient ratio in the reaction steps of the respective metal components may be controlled.

In this case, for example, assuming the respective compositions of In and Sn in the SnIn eutectic alloy as $W_A$, $W_B$ (weight %), following formula (13), (14) are established.

$$\chi_A = 1/(1+(W_B/W_A)(M_A/M_B)) \quad (13)$$

$$\chi_B = 1/(1+(W_A/W_B)(M_B/M_A)) \quad (14)$$

Accordingly, by substituting the above-mentioned formulae (13), (14) for the formulae (10), (11), the vapor flux weight ratio $\Gamma_A/\Gamma_B$ is expressed by the following formula (15).

$$\Gamma_A/\Gamma_B = (\gamma_A \chi_A P_A/\gamma_B \chi_B P_B)(M_A/M_B)^{1/2} = (\gamma_A P_A/\gamma_B P_B)(M_B/M_A)^{1/2}(W_A/W_B) \quad (15)$$

By substituting a molecular weight $M_A = 114.818$ of In, a molecular weight of $M_B = 118.710$ of Sn, a weight % $W_A = 0.52$ of In and a weight % $W_B = 0.48$ of Sn for the formula (13), (14), $\chi_A = 0.528$, $\chi_B = 0.472$ are obtained.

Accordingly, to calculate the ratio $(\gamma_A P_A/\gamma_B P_B)$ which makes the left side $(\Gamma_A/\Gamma_B)$ in the formula (15) assume 0.52/0.48, following value is obtained.

$$(\gamma_A P_A/\gamma_B P_B) = (\Gamma_A/\Gamma_B)(M_B/M_A)^{1/2}(\chi_B/\chi_A) = 0.98 \quad (16)$$

Accordingly, by performing the vapor deposition under conditions in which the activity coefficient and the vapor pressure satisfy the formula (16), it is possible to form a SnIn eutectic alloy film on the Cu film such that the ratio between In and Sn becomes In:SN=52:48.

Here the above-mentioned product of the vapor pressure ratio and the activity coefficient ratio $(\gamma_A P_A/\gamma_B P_B)$ is controllable by controlling the temperature of the evaporation source, the degree of vacuum during vapor deposition and the temperature of object to be vapor-deposited at the time of actually performing the vapor deposition.

Among these factors, a temperature of the base alloy which constitutes the evaporation source can be controlled by adjusting energy of electron beams for heating when an electron beam vapor deposition apparatus is used. When the temperature of the base alloy in a molten state is changed due to the adjustment of the electron beam energy, evaporation speeds and activities from the evaporation sources of respective metal components are respectively changed, wherein relative change rates of the evaporation speeds and the activities corresponding to the temperature change differ from each other for respective metal components and hence, the vapor pressure ratio is changed.

Next, the degree of vacuum during the vapor deposition is adjusted by evacuating the inside of a vapor deposition vessel using a vacuum pump. When a sum of vapor pressures of the respective metal components is changed due to the adjustment of the degree of vacuum, molar fractions of respective metal components are changed, and the activities of the respective metal components are changed. However, by making the relative change rates of degree of the activities with respect to the change of vacuum different from each other for respective metal components, the vapor pressure ratio is changed.

Next, the temperature of the Cu electrode which constitutes the object to be evaporated can be adjusted by the electricity supplied to the heating heater. When the temperature of the Cu electrode which constitutes the object to be evaporated is changed due to the adjustment of the electricity supplied to the heater, the activities in the reactions between the respective metal components In, Sn and the base material Cu are changed. However, since the-relative change rates of the activities corresponding to the temperature change differ for respective metal components, the activity coefficient ratio is change.

Among respective control factors consisting of the temperature of the evaporation source, the degree of vacuum during vapor deposition and the temperature of the object to be vapor-deposited, any one of these control factors may be controlled or a plurality of control factors may be controlled in combination.

Here, in obtaining control parameter values corresponding to the target film composition ratio using the vapor deposition process provided with conditions, to obtain provisional control parameter values which are set in the first process, a method which controls the vapor pressure ratio of respective metal components is more appropriate, while to obtain corrected values of control parameters which are set in the second or subsequent process which is performed thereafter, a method which controls the product of the vapor pressure ratio of the respective metal components and the activity coefficient ratio is more appropriate and hence, at a stage of providing conditions, it is more efficient to combine both methods.

Further, the method which can obtain the vapor deposition film having the same composition as the base alloy of the evaporation source as the low-melting-point metal layer has been explained heretofore, the method for forming the low-melting-point metal layer according to the present invention is not limited to the above-mentioned method and may obtain the vapor deposition film having the composition different from the composition of the base alloy of the evaporation source. In this case, corresponding to the relationship between the composition ratio of the base alloy of the evaporation source and the target film composition ratio, a control target object of the vapor pressure ratio of the respective metal components or a control target value of the product of the vapor pressure ratio of the respective metal components and the activity coefficient ratio is determined.

Figure 1B:
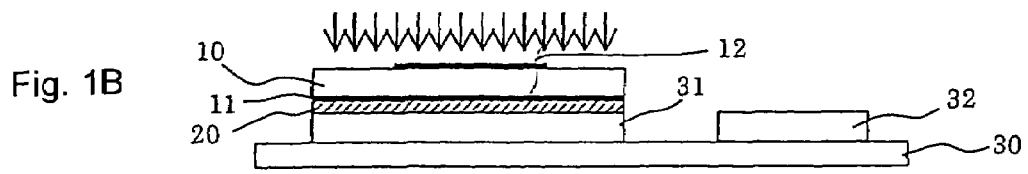

Next, in a state that the low-melting-point metal layer 20 and the first circuit electrode 31 are arranged to face each other as shown in FIG. 1(b), the semiconductor die 10 is moved to the circuit board 30 side and is arranged such that the low-melting-point metal layer 20 and the first circuit electrode 31 are brought into contact with each other. Then, when the heating-and-pressurizing is performed in such a state at a temperature of 200° C. or less, the low-melting-point metal layer 20 is melted and hence, the low-melting-point metal is diffused into the back-surface die electrode 11 and the first circuit electrode 31 by solid-liquid diffusion thus performing the first joining step.

Here, the positioning of the above-mentioned electrodes and the manipulation such as moving, heating, pressurizing and the like are performed by a conventionally known mounting equipment. For example, it is possible to perform such positioning and manipulation using a flip chip bonder or the like. Further, the positioning of electrodes can be accurately performed by determining coordinates using a camera or the like.

According to the present invention, it is possible to perform the heating-and-pressurizing at a temperature of 200° C. or less. Accordingly, the present invention can perform the joining at the low temperature compared to 200 to 250° C. which is the general heating temperature in the conventional solder joining and hence, thermal damages applied to the semiconductor die 10 can be suppressed. In this case, it is more desirable to set the heating temperature at the time of joining to a temperature higher than melting points of the low-melting-point metal layer 20 by 0 to 100° C.

Further, here, it is preferable that the heating-and-pressurizing state is maintained until the low-melting-point metal layer 20 is completely diffused in the back-surface die electrode 11 and the first circuit electrode 31 by the solid-liquid diffusion. Accordingly, the joining portion after joining is formed as a single alloy layer as a whole. Although the alloy layer has a concentration gradient of the low-melting-point metal which advances toward respective electrode sides from a center portion thereof, the alloy layer forms the single alloy layer as a whole. Accordingly, no intermediate alloy layer is separately formed in the joining portion and hence, the reliability of the joined portion does not depend on the characteristic of the interposed joining material but mainly depends on the base metals of the electrodes. Accordingly, compared to soldering or the like, it is possible to enhance the reliability of the connection portion.

In this manner, time which is necessary for the low-melting-point metal layer to be completely diffused in the electrode by solid-liquid diffusion is, although the time differs depending on the heating temperature, the pressure, the electrode material, the material of the low-melting-point metal or the like, usually, 10 to 180 seconds.

Further, the pressurizing condition is, although the pressurizing condition differs depending on the above-mentioned heating temperature, the electrode material, the material of the low-melting-point metal or the like, preferably 10 to 30 MPa. Here, for example, as in the case of a surface of an electrode which is formed by electrolytic plating or the like, even when the surfaces of the pair of electrodes to be joined are formed of a surface which exhibits the surface roughness Ra of 0.4 μm to 1.0 μm, the low-melting-point metal melts and is filled in the irregularities and hence, it is possible to obtain a favorable joining state even under the above-mentioned pressurizing condition.

As described above, when each low-melting-point metal layer is formed of the alloy layer which is obtained by reacting two or more single metal layers, it is desirable that, first of all, preheating is performed at a temperature equal to or lower than melting points of respective single metals thus forming a metal layer of two or more single metal layers in solid solution and, thereafter, heating-and-pressurizing is performed at a temperature equal to or less than 200° C.

In this case, although the temperature of the preheating may be suitably selected based on kinds and film thicknesses of the single metal layers which form the alloy layer, for example, when the alloy layer adopts the two-layered constitution formed of the Sn layer and the In layer, it is preferable to perform the preheating at a temperature of 110 to 125° C.

On the other hand, in the present invention, the heating-and-pressurizing state may by maintained until the low-melting-point metal layer 20 forms the intermediate alloy layer between the back-surface-die electrode 11 and the first circuit electrode 31. In this case, the low-melting-point metal layer is not completely diffused and it is sufficient to perform the heating until the intermediate alloy layer is formed and hence, time necessary for joining can be largely shortened.

In this case, the time necessary for forming the intermediate alloy layer is properly determined based on the heating temperature, pressure, the electrode material, the material of the low-melting-point metal and the like, the time is shorter than the corresponding time necessary in the above-mentioned embodiment in which the low-melting-point metal is completely diffused and maybe usually 10 to 150 seconds. Here, it is preferable that a thickness of the intermediate alloy layer in the joining portion is set to a value which falls within a range from 1 to 5 μm. The explicit presence of the intermediate alloy layer can be confirmed by the observation of the cross section and, at the same time, the presence of the intermediate alloy layer can be also confirmed by the measurement of the electric resistance, the thermal resistance or the like in a non-destructive manner.

Here, when the surplus low-melting-point metal remains after the formation of the intermediate alloy layer, by pushing out the surplus low-melting-point metal to an outer periphery of a side surface of the joining portion by pressurizing, it is sufficient to supply a quantity of the low-melting-point metal which is equal to or more than a quantity necessary to form the intermediate alloy layer and hence, a strict management of the supply quantity of the low-melting-point metal becomes unnecessary. However, as in the case of the semiconductor module of the present invention, it is necessary to ensure an insulation distance between the electrode and the wiring and hence, in many-cases,-it is not appropriate to push out the surplus low-melting-point metal to the outer periphery of the side surface of the joining portion. In such a case, it is preferable to manage the supply quantity, that is, the thickness of the low-melting-point metal such that the quantity of low-melting-point metal which is strictly necessary for forming the intermediate alloy layer is supplied.

Figure 2:
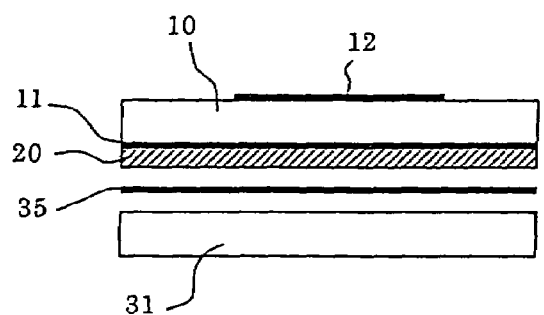
FIG. 2 is a view showing another embodiment of the first joining step of the manufacturing method of the present invention, and also is a view showing a state that a metal foil is interposed

In the present invention, as shown in FIG. 2, in a state that the back-surface-die-electrode 11 which is formed on the low-melting-point metal layer 20 and the first circuit electrode 31 are arranged to face each other, a metal foil 35 having a thickness of 1 to 500 μm may be further interposed between the back-surface-die-electrode 11 and the first circuit electrode 31 and, thereafter the heating-and-pressurizing may be performed.

In this manner, by using the metal foil as the intermediate joining material, a layer in which the intermediate joining material diffuses is expanded in the supplied low-melting-point metal region and hence, even when the joining time is limited, it is possible to prevent a non-reacted portion of the low-melting-point metal from remaining as it is.

Further, when the above-mentioned pair of electrodes are made of materials different from each other and the diffusion speed of the low-melting-point metal that the low-melting-point metal is diffused -into the electrode differs between the respective electrodes, the layer into which the intermediate joining material is diffused also expands into the non-reacted portion of the low-melting-point metal on the electrode side with the delayed diffusion speed and hence, it is possible to prevent the non-reacted portion of the low-melting-point metal from remaining as it is and hence, the occurrence of a defect on the joining interface can be prevented and the stable joining of the different kinds of material can be realized.

As a material of the interposed metal foil, it is preferable to use the same material as electrode which exhibits the faster diffusion speed. For example, in FIG. 2, when the back-surface-die-electrode 11 is formed of Ni and the first circuit electrode 31 is formed of Cu, since Cu which is the low melting point metal exhibits the faster diffusion speed than Ni and hence, with the use of a Cu foil as the metal foil 35 of the intermediate joining material, the expansion of the layer in which the intermediate joining material is diffused in the non-reacted portion of the low-melting-point metal becomes faster whereby it is possible to more reliably prevent the non-reaction portion which is held as the low melting point metal from remaining as it is in the limited joining time.

Here, the material of the metal foil which is interposed as the intermediate joining material is not limited to the same material as the electrode which exhibits the faster diffusion speed. That is it is sufficient when the-material exhibits the sufficiently fast expansion of the layer in which the intermediate joining material is diffused in the non-reacted portion of the low-melting-point metal within the limited joining time and can surely prevent the non-reacted portion of the low-melting-point metal from remaining as it is.

Here, in the constitution which interposes the metal foil as the above-mentioned intermediate joining material, with respect to the constitution which determines the portion where the low-melting-point metal is layer 20 is formed, the constitution is not limited to the constitution in which the low-melting-point metal layer 20 is formed on the back-surface-die-electrode 11 as shown in FIG. 2. That is, the low-melting-point metal layer 20 may be formed on both of the back-surface-die-electrode 11 and the first circuit electrode 31 or the low-melting-point metal layer 20 may be formed on one surface or both surfaces of the metal foil 35.

Figure 1C:
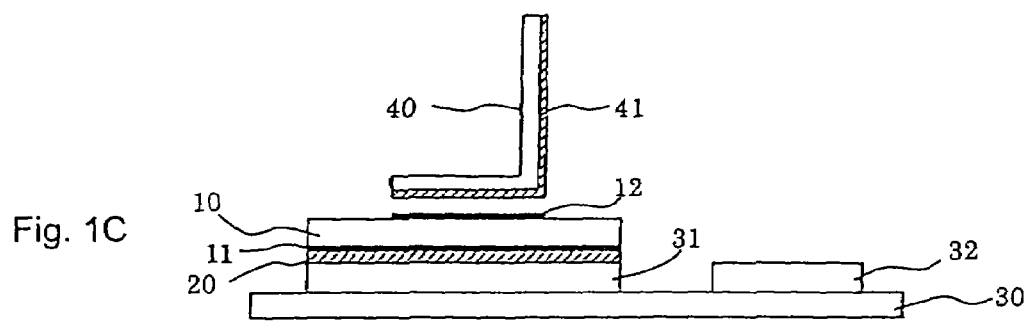

Next, as shown in FIG. 1(c), an L-shaped lead frame 40 which constitutes the connection wire is arranged on the front-surface die electrode 12 which is formed on the semiconductor die 10. Further, in this embodiment, on a surface of the lead frame 40 on a side which is connected to the front-surface die electrode 12, a low-melting-point metal layer 21 is preliminarily formed.

As a material of the lead frame 40, Cu or the like is mainly used, for example. However, the material of the lead frame 40 is not limited. Further, a trace quantity of other metal element such as Fe, Ni, Si, Zn, Ag, Sn or the like is added. Further, on a surface of the lead frame 40, a plating layer made of Ni or Ni/Au, for example, maybe formed. Here, the connection wire in the present invention is not limited to a plate-like body such as a lead frame and may be formed in a linear shape such as an aluminum wire used in wire bonding.

In forming the low-melting-point metal layer 21, it may be possible to use the substantially same material and the same forming method as the above-mentioned low-melting-point metal layer 20. Further, the low-melting-point metal layer 21 may be formed on the whole surface of the lead frame 40 or a portion of the lead frame 40 which is joined to the front-surface die electrode 12.

Figure 1D:
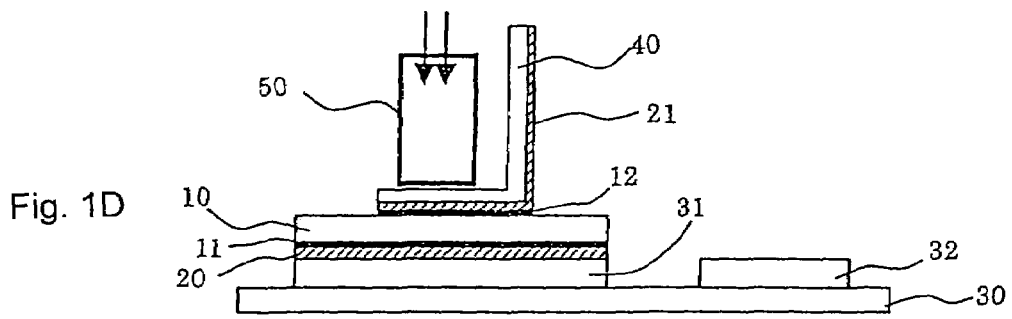

Further, as shown in FIG. 1(d), the low-melting-point metal layer 21 may be heated and pressurized by a heating-and-pressurizing device 50 so as to join the front-surface die electrode 12 of the semiconductor die 10 and one end of the lead frame 40. Accordingly, the low-melting-point metal layer 21 is melted and, further, is diffused into the front-surface die electrode 12 and one end of the lead frame 40 by solid-liquid diffusion thus performing a second joining step. Here, conditions for heating-and-pressurizing can be suitably selected depending on the materials of the electrodes to be joined and the material of the low-melting-point metal and the conditions may differ from the conditions of the above-mentioned first joining step.

Figure 1E:
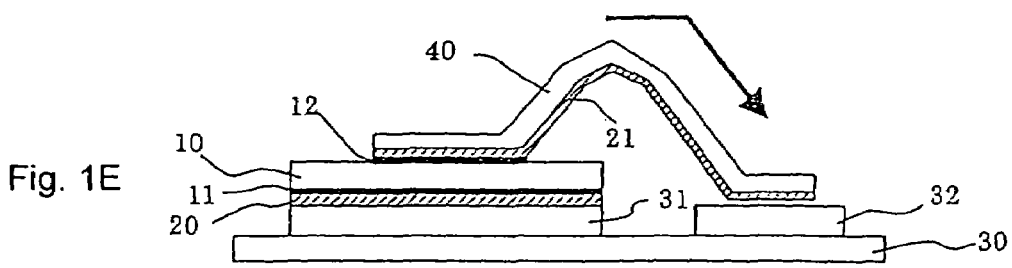
Figure 1F:
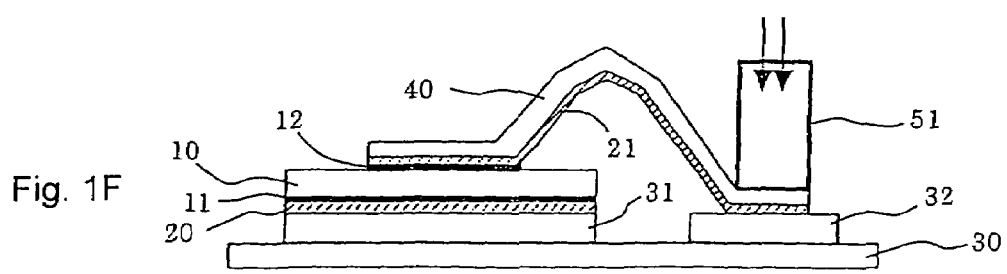

Next, as shown in FIG. 1(e), another end of the lead frame 40 is bent and tilted. Then, as shown in FIG. 1(f), using a heating-and-pressurizing device 51, a second circuit electrode 32 and another end of the lead frame 40 are joined to each other. Accordingly, the low-melting-point metal layer 21 is melted and, further, is diffused into the second circuit electrode 32 and another end of the lead frame 40 by solid-liquid diffusion thus performing a third joining step. Here, conditions for heating-and-pressurizing can be suitably selected depending on the materials of the electrodes to be joined and the material of the low-melting-point metal and the conditions may differ from the conditions of the above-mentioned first joining step and the second joining step.

By performing the above-mentioned first joining step, the second joining step and the third joining step, the manufacture of the semiconductor module is completed. Here, in the present invention, the joining which uses the above-mentioned low-melting-point metal layer may be performed in all joining steps as in the case of this embodiment or may be performed in at least one of the first to third steps.

Figure 3:
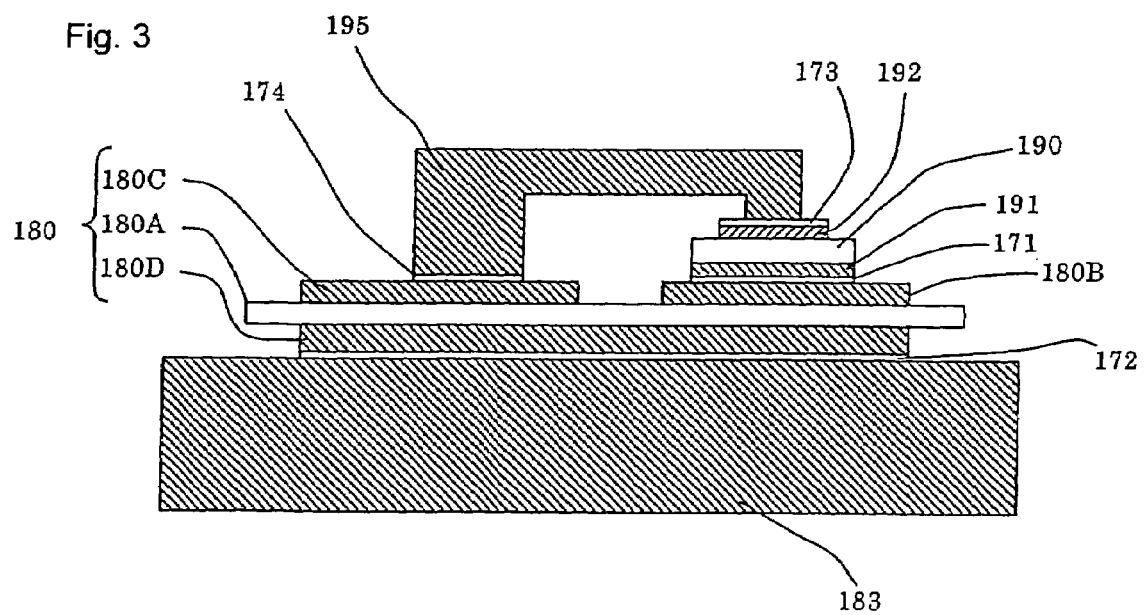
FIG. 3 is a schematic constitutional view showing the constitution which is different from FIG. 1 of a semiconductor module which becomes an object of a manufacturing method of the present invention.
Figure 4:
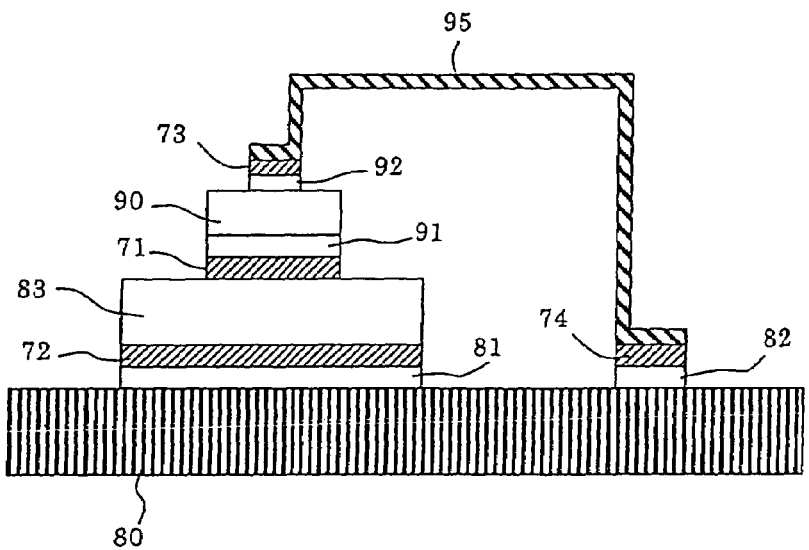
FIG. 4 is a schematic constitutional view showing one example of the semiconductor module of a prior art.

Next, the manufacturing method of the present invention is also applicable to a semiconductor module having the constitution shown in FIG. 3. FIG. 3 shows a constitutional example different from the constitution shown in FIG. 1(f) of the semiconductor module which becomes an object of the manufacturing method of the present invention.

Figure 5:
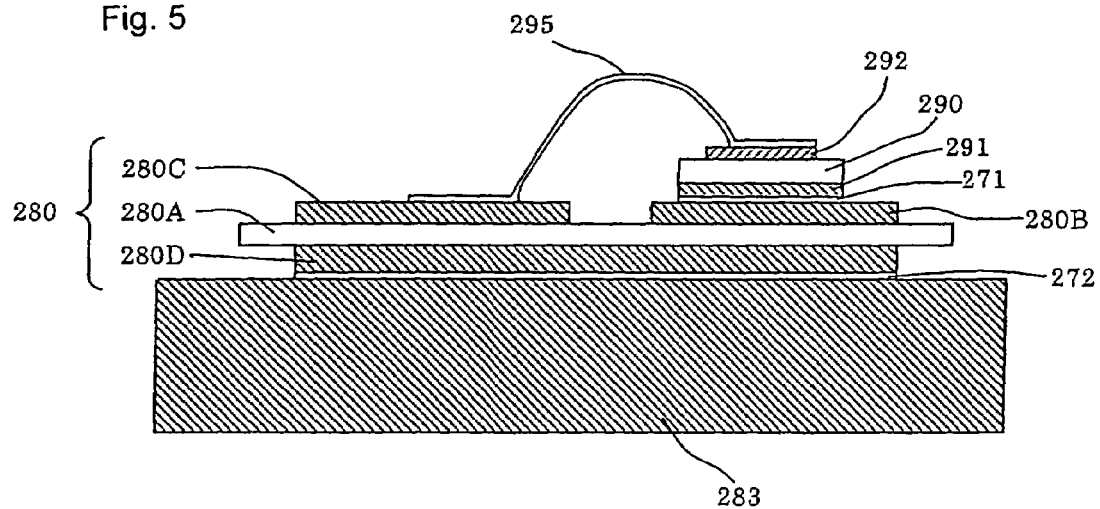
FIG. 5 is a schematic constitutional view showing another example of the semiconductor module of a prior art.

The semiconductor module shown in FIG. 3 has the basic structure which is similar to the basic structure of the prior art shown in FIG. 5. The semiconductor module is mainly constituted of a circuit board 180 formed of a DBC board which is joined to a heat radiating plate 183, a semiconductor die 190 formed of a semiconductor chip which is joined to the circuit board 180, and a lead frame 195 which has one end thereof connected to the semiconductor die 190, wherein the lead frame 195 is used in place of the bonding wire 295 in the constitution shown in FIG. 5.

On both front and back surfaces of the semiconductor die 190, electrodes are formed, wherein a back-surface-die electrode 191 which constitutes a collector electrode is formed on the back surface of the semiconductor die 190 and a front-surface-die electrode 192 which constitutes an emitter electrode is formed on the front surface of the semiconductor die 190. Further, the heat radiating plate 183 is made of a metal material such as Cu, while the circuit board 180 which is formed of the DBC board is configured such that electrodes 180B, 180C and 180D which are formed of a conductive layer made of Cu or the like are formed on both surfaces of a ceramic substrate 180A. Further, the lead frame 195 is made of a metal material such as Cu.

To the back-surface-die electrode 191 of the semiconductor die 190, the first circuit electrode 180B which forms a collector conductive layer on an upper surface of the circuit board 180 is joined by means of a joining portion 171, while the third circuit electrode 180D which constitutes a heat-radiating-plate conductive layer on a lower surface of the circuit board 180 is joined to the heat radiating plate 183 by means of a joining portion 172.

On the other hand, to the front-surface-die electrode 192 of the semiconductor die 190, one end of the lead frame 195 is joined by means of a joining portion 173. Further, another end of the lead frame 195 is joined to the second circuit board 180C which constitutes a lead-frame conductive layer on the upper surface of the circuit board 180 by means of a joining portion 174.

To all of the respective joining portions 171 to 174 in the above-mentioned semiconductor module shown in FIG. 3, the solid-liquid diffusion joining via the low-melting-point metal layer similar to the solid-liquid diffusion joining in the manufacturing method explained in conjunction with FIG. 1 and FIG. 2 is applicable. Further, the method of forming the low-melting-point metal layer explained in conjunction with FIG. 1 is also applicable to the formation of the low-melting-point metal layer in this embodiment.

Here, in FIG. 3, it is possible to simultaneously join all joining portions 171 to 174 by preliminarily preparing a U-shaped body as the lead frame 195. Further, in the same manner as FIG. 1, the lead frame 195 may be configured to be bent in a middle course and the joining portions 171 to 174 may be sequentially joined. Further, it is also possible to adopt the constitution in which among the joining portions 171 to 174, the solid-liquid diffusion joining is applied to at least one joining portion out of the joining portions 171, 173 and 174 on the upper surface side of the circuit board 180 and the joining portion 172 on the lower surface side of the circuit board 180.

Further, in FIG. 3, the heat radiating member is formed of the plate-like heat radiating plate 183. However, a shape of the heat radiating member in the semiconductor module which becomes the object of the manufacturing method of the present invention is not limited to such a plate shape and may be formed into a shape which allows the heat radiating member to be connectable with the circuit electrode formed on a circuit board such as the DBC board 180, for example.

Then, also with respect to the semiconductor module having the constitution shown in FIG. 3, by applying the manufacturing method of the present invention, the respective joining portions 171 to 174 are formed into the highly reliable joining portions by using solid-liquid diffusion joining in place of the conventional solder joining.

Here, although two constitutions shown in FIG. 1(*f*) and FIG. 3 are exemplified as the constitution of the semiconductor module which becomes the object of the manufacturing method of the present invention, the shapes and materials of the circuit board, connecting member such as the lead frame and the heat radiating member, and the specific constitution of the combination of the these parts and the semiconductor die in the semiconductor module are suitably selected depending on the design specification of the semiconductor module. That is, the constitution of the semiconductor module to which the manufacturing method of the present invention is applicable is not limited to the constitutions shown in FIG. 1(*f*) and FIG. 3.

Further, the base metal materials which constitute the conductive portions which become objects of joining such as the circuit electrode, die electrode, connecting member such as the lead frame and the heat radiating member in the present invention are exactly as explained heretofore. However, among the base metal materials, Cu is particularly suitable as the base metal material of the conductive portions such as electrodes from a viewpoint that Cu enhances a diffusion coefficient of the low-melting-point metal.

That is, a degree of diffusion of the solid-liquid diffusion or the like in the joining of the present invention is generally expressed with the diffusion coefficient, wherein as the value of the diffusion coefficient becomes larger, the diffusion is performed more easily. The diffusion coefficient D is experimentally expressed by a formula $D=D_0\exp(-Q/RT)$. Here, the symbols represent, $D_0$: frequency term Q: activation energy, R: gas constant and T: absolute temperature.

Further, when In is selected as a low-melting-point metal-made material, for example, the diffusion coefficient exhibits $7.18\times10^{-6}$ when the material of the base metal is Au, while the value becomes extremely large as expressed by a formula $1.23\times10^{-4}$ when the material is Cu.

Further, also in case Sn is selected as a low-melting-point metal-made material, the diffusion coefficient exhibits $3.96\times10^{-6}$ when the material of the base metal is Au, while the value becomes large as expressed by a formula $1.05\times10^{-5}$ when the material is Cu.

Still further, when the material of the base metal is Ni, there exists no low-melting-point metal having a large diffusion coefficient with respect to the material.

In this manner, when the material of the base metal is Cu, the diffusion coefficient of the low-melting-point metal becomes particularly large value and hence, a diffusion reaction speed in the solid-liquid diffusion is performed fast. Accordingly, Cu is particularly preferable to achieve the solid-liquid diffusion which does not generate a residual low-melting-point metal single layer.

As has been described above, according to the present invention, it is possible to provide the manufacturing method of a semiconductor module which can perform the joining at a low temperature within a short time at the time of joining the electrode on the semiconductor die, the electrode on the circuit board, the connecting member such as the lead frame, and the heat radiating member, and can perform the joining without using the solder joining medium thus enabling the acquisition of the highly reliable joining portions.

Hereinafter, the manufacturing method of the semiconductor module of the present invention is explained in further detail in conjunction with examples.

EXAMPLE 1

A following semiconductor module is manufactured in accordance with the steps shown in FIG. 1.

First of all, an IGBT die is used as the semiconductor die. On the semiconductor die, as the front-surface-die electrode and the back-surface-die electrode, a three-layered electrode which is made of Ti/Ni/Au and has an Au layer on a topmost surface thereof is formed.

On the other hand, on an Al-base insulation circuit board made of Al as a base material, an electrode made of Cu and having a thickness of 0.32 mm is formed as the first circuit electrode.

Then, as the connecting member, a lead frame made of Cu alloy and having a thickness of 0.25 mm is used.

Next, the low-melting-point metal layer made of SnIn (melting point: 117° C.) and having a thickness of 5 μm is formed on the back-surface-die electrode by sputtering, and the low-melting-point metal layer made of SnIn (melting point: 117° C.) and having a thickness of 5 μm is formed on the whole surface of one surface of the lead frame by sputtering.

Then, as shown in FIG. 1(a), the back-surface-die electrode of the semiconductor die and the first circuit electrode are aligned with each other and, thereafter, as shown in FIG. 1(b), the first joining step is performed by heating-and-pressurizing these parts at a temperature of 137° C. which is 20° C. higher than the melting point of the SnIn at a pressure of 30 MPa for 180 seconds.

Next, as shown in FIG. 1(c), the L-shape lead frame 40 is arranged on the front surface-die electrode which is formed on the semiconductor die, and as shown in FIG. 1(d), the second joining step is performed by heating-and-pressurizing these parts at a temperature of 137° C. at a pressure of 20 MPa for 120 seconds.

Thereafter, as shown in FIG. 1(e), another end of the lead frame is bent and tilted, and the third joining step is performed by heating-and-pressurizing the second circuit electrode formed on the circuit board and another end of the lead frame at a temperature of 180° C. at a pressure of 30 MPa for 120 seconds thus manufacturing the semiconductor module.

Accordingly, it is possible to manufacture the semiconductor module at a temperature equal to or below 200° C. without soldering.

EXAMPLE 2

The semiconductor module is manufactured under the same conditions as the example 1 except for the following. That is, in the example 1, the low-melting-point metal layer having a total thickness of 1 μm is formed by sequentially stacking a Sn layer made of a single metal layer and having a thickness of 0.48 μm and an In layer made of a single metal layer and having a thickness of 0.52 μm using sputtering. In the respective first to third steps, the preheating is performed at a temperature of 120° C. for 10 seconds, and the Sn layer and the In layer are formed into the solid solution thus obtaining a SnIn alloy layer. Thereafter, the first to third joining steps are performed.

Accordingly, in this example 2, in the same manner as the example 1, it is also possible to manufacture the semiconductor module at a temperature equal to or below 200° C. without soldering.

INDUSTRIAL APPLICABILITY

The present invention is suitably applicable to a semiconductor module such as a power semiconductor which uses a lead frame and aluminum wire bonding, for example.

The invention claimed is:

1. A manufacturing method of a semiconductor module comprising:
    a first joining step for joining first circuit electrodes which are formed on a circuit board and back-surface-side die electrodes of a semiconductor die which forms die electrodes on both front and back surfaces;
    a second joining step for joining the front-surface-side die electrodes of the semiconductor die and one ends of linear or plate-like connecting members; and
    a third joining step for joining another ends of the connecting members and second circuit electrodes which are formed on the circuit board;
    wherein each of the first joining step, the second joining step and the third joining step, a low-melting-point metal layer is preliminarily formed on at least one of a pair of conductive portions to be connected with each other and, thereafter, the pair of conductive portions are arranged to face each other and are heated and pressurized at a temperature which melts at least the low-melting-point metal thus diffusing the low-melting-point metal layer into the pair of conductive portions by solid-liquid diffusion whereby the pair of conductive portions are joined to each other; and
    wherein the first joining step, the second joining step and the third joining step are performed sequentially.

2. A manufacturing method of a semiconductor device comprising:
    a first joining step for joining first circuit electrodes which are formed on a circuit board and back-surface-side die electrodes of a semiconductor die which forms die electrodes on both front and back surfaces;
    a second joining step for joining the front-surface-side die electrodes of the semiconductor die and one ends of linear or plate-like connecting members;
    a third joining step for joining another ends of the connecting members and second circuit electrodes which are formed on the circuit board; and
    a fourth joining step for joining a third circuit electrode formed on the circuit board and a heat radiating member made of metal;
    wherein each of the first joining step, the second joining step and the third joining step and the fourth joining step, a low-melting-point metal layer is preliminarily formed on at least one of a pair of conductive portions to be connected with each other and, thereafter, the pair of conductive portions are arranged to face each other and are heated and pressurized at a temperature which melts at least the low-melting-point metal thus diffusing the low-melting-point metal layer into the pair of conductive portions by solid-liquid diffusion whereby the pair of conductive portions are joined to each other; and
    wherein the first joining step, the second joining step. the third joining step and the fourth joining step are performed sequentially.

3. A manufacturing method of a semiconductor module according to claim 1 or 2, wherein the low-melting-point metal layer is formed on at least one of the pair of conductive portions, a metal foil is interposed between the pair of conductive portions, and the pair of conductive portions are heated and pressurized.

4. A manufacturing method of a semiconductor module comprising:
    a first joining step for joining first circuit electrodes which are formed on a circuit board and back-surface-side die electrodes of a semiconductor die which forms die electrodes on both front and back surfaces;
    a second joining step for joining the front-surface-side die electrodes of the semiconductor die and one ends of linear or plate-like connecting members; and
    a third joining step for joining another ends of the connecting members and second circuit electrodes which are formed on the circuit board;
    wherein each of the first joining step, the second joining step and the third joining step, a low-melting-point metal layer is preliminarily formed on at least one surface or both surfaces of a metal foil, and, thereafter, the pair of conductive portions to be connected are arranged to face each other, the metal foil is interposed between the pair of conductive portions, the pair of conductive portions are heated and pressurized at a temperature which melts at least the low-melting-point metal thus diffusing the low-melting-point metal layer into the pair of conductive portions by solid-liquid diffusion whereby the pair of conductive portions are joined to each other; and
    wherein the first joining step, the second joining step and the third joining step are performed sequentially.

5. A manufacturing method of a semiconductor module comprising:
- a first joining step for joining first circuit electrodes which are formed on a circuit board and back-surface side die electrodes of a semiconductor die which forms die electrodes on both front and back surfaces;
- a second joining step for joining the front-surface-side die electrodes of the semiconductor die and one ends of linear or plate-like connecting members;
- a third joining step for joining another ends of the connecting members and second circuit electrodes which are formed on the circuit board; and
- a fourth joining step for joining a third circuit electrode formed on the circuit board and a heat radiating member made of metal;
- wherein each of the first joining step, the second joining step and the third joining step and the fourth joining step, a low-melting-point metal layer is preliminarily formed on at least one surface or both surfaces of a metal foil, and, thereafter, the pair of conductive portions to be connected are arranged to face each other, the metal foil is interposed between the pair of conductive portions, the pair of conductive portions are heated and pressurized at a temperature which melts at least the low-melting-point metal thus diffusing the low-melting-point metal layer into the pair of conductive portions by solid-liquid diffusion whereby the pair of conductive portions are joined to each other; and
- wherein the first joining step, the second joining step, the third joining step and the fourth joining step are performed sequentially.

6. A manufacturing method of a semiconductor module according to any one of claims 1, 2, 4 and 5, wherein the low-melting-point metal layer contains at least one selected from a group consisting of SnIn, In, Bi, SnBi.

7. A manufacturing method of a semiconductor module according to claim 6, wherein a heating temperature at the time of the joining is a temperature which is 0 to 100° C. higher than the melting point of the low-melting-point metal.

8. A manufacturing method of a semiconductor module according to any one of claims 1, 2, 4 and 5, wherein a total thickness of the low-melting-point metal layer which is formed preliminarily between the pair of conductive portions assumes a value which falls within a range from 0.1 to 1 µm.

9. A manufacturing method of a semiconductor module according to any one of claims 1, 2, 4 and 5, wherein a material of the pair of conductive portions is one selected from a group consisting of Cu, Ni, Au, Al or alloy thereof.

10. A manufacturing method of a semiconductor module according to any one of claims 1, 2, 4 and 5, wherein the heating-and-pressurizing is performed until the low-melting-point metal layer is completely diffused in the pair of conductive portions by solid-liquid diffusion.

11. A manufacturing method of a semiconductor module according to any one of claims 1, 2, 4 and 5, wherein the heating-and-pressurizing is performed until the low-melting-point metal layer forms an intermediate alloy layer between the pair of conductive portions.

12. A manufacturing method of a semiconductor module according to any one of claims 1, 2, 4 and 5, wherein the connection member is a lead frame.

13. A manufacturing method of a semiconductor module according to any one of claims 1, 2, 4 and 5, wherein the surfaces of the pair of conductive portions are formed of coarse surfaces having the surface roughness Ra of 0.4 to 10 µm.

14. A manufacturing method of a semiconductor module according to any one of claims 1, 2, 4 and 5, wherein the low-melting-point metal layer is formed such that at least two kinds of metals which can form alloy are stacked in two layers or more, and the stacked metal layers are preheated to make the metal layers react with each other to form an alloy layer.

15. A manufacturing method of a semiconductor module according to any one of claims 1, 2, 4 and 5, wherein the low-melting-point metal layer is formed by vapor-depositing alloy which constitutes an evaporation source and, at the time of performing the vapor deposition, an evaporation pressure ratio in reaction steps of respective metal components of the alloy is controlled thus forming a film having the target alloy composition.

16. A manufacturing method of a semiconductor module according to any one of claims 1, 2, 4 and 6, wherein the low-melting-point metal layer is formed by vapor-depositing alloy which constitutes an evaporation source and, at the time of performing the vapor deposition, a product of an evaporation pressure ratio and an active coefficient ratio in reaction steps of respective metal components of the alloy is controlled thus forming a film having the target alloy composition.

17. A manufacturing method of a semiconductor module according to claim 1, wherein the low-melting-point metal layer includes a eutectic alloy of Sn/In.

18. A manufacturing method of a semiconductor module according to claim 14, wherein the low-melting-point metal layer has a melting point no higher than 220.

19. A manufacturing method of a semiconductor module according to claim 14, wherein the stacked metal layers are preheated at a temperature no higher than the lowest one of the melting points of the at least two kinds of metal.

20. A manufacturing method of a semiconductor module according to claim 19, wherein Sn and In are stacked in two or more layers, and the stacked metal layers are preheated at a temperature of 110 to 125 0C.

21. A manufacturing method of a semiconductor module according to claim 1, wherein the semiconductor module comprises a power semiconductor module.

22. A manufacturing method of a semiconductor module according to claim 21, wherein the power semiconductor module comprises an insulating gate type bipolar transistor.

* * * * *

UNITED STATES PATENT AND TRADEMARK OFFICE
CERTIFICATE OF CORRECTION

PATENT NO. : 7,670,879 B2  Page 1 of 1
APPLICATION NO. : 10/591723
DATED : March 2, 2010
INVENTOR(S) : Kozo Fujimoto et al.

It is certified that error appears in the above-identified patent and that said Letters Patent is hereby corrected as shown below:

Claim 16; Column 26, line 27: DELETE "claims 1, 2, 4 and 6"

INSERT --of claims 1, 2, 4 and 5--

Claim 18; Column 26, line 40: DELETE "than 220"

INSERT --than 220°C--

Claim 20; Column 26, line 48: DELETE "to 1250C"

INSERT --to 125°C--

Signed and Sealed this

Third Day of August, 2010

David J. Kappos
*Director of the United States Patent and Trademark Office*